US008427627B2

(12) United States Patent
Kivits et al.

(10) Patent No.: US 8,427,627 B2
(45) Date of Patent: Apr. 23, 2013

(54) LITHOGRAPHIC APPARATUS AND METHODS

(75) Inventors: Koen Kivits, Helmond (NL); Hans Jansen, Eindhoven (NL); Vasco Miguel Matias Serrao, Hasselt (BE)

(73) Assignee: ASML Netherlands B.V., Veldhoven (NL)

( * ) Notice: Subject to any disclaimer, the term of this patent is extended or adjusted under 35 U.S.C. 154(b) by 617 days.

(21) Appl. No.: 12/398,403

(22) Filed: Mar. 5, 2009

(65) Prior Publication Data

US 2009/0296052 A1   Dec. 3, 2009

Related U.S. Application Data (60) Provisional application No. 61/064,487, filed on Mar. 7, 2008, provisional application No. 61/071,706, filed on May 14, 2008.

(51) Int. Cl.
*G03B 27/52* (2006.01)
*G03B 27/32* (2006.01)

(52) U.S. Cl.
USPC ............................................. 355/30; 355/77

(58) Field of Classification Search .................. 355/30
See application file for complete search history.

(56) References Cited

U.S. PATENT DOCUMENTS

| | | | |
|---|---|---|---|
| 4,509,852 A | 4/1985 | Tabarelli et al. | |
| 7,450,217 B2 | 11/2008 | Boogaard et al. | |
| 7,561,250 B2 * | 7/2009 | Liebregts et al. | 355/53 |
| 7,628,865 B2 | 12/2009 | Singh | |
| 7,969,548 B2 | 6/2011 | Stavenga et al. | |
| 2004/0136494 A1 | 7/2004 | Lof et al. | |
| 2004/0165160 A1 * | 8/2004 | Van Beek et al. | 355/30 |
| 2004/0207824 A1 | 10/2004 | Lof et al. | |
| 2007/0127001 A1 | 6/2007 | Van Der Hoeven | |
| 2007/0258072 A1 | 11/2007 | Nagasaka et al. | |
| 2007/0260419 A1 * | 11/2007 | Hagiwara | 702/150 |
| 2009/0174870 A1 * | 7/2009 | De Jong et al. | 355/30 |
| 2009/0323035 A1 * | 12/2009 | Fujiwara | 355/53 |
| 2010/0134772 A1 | 6/2010 | Nagasaka et al. | |
| 2010/0195068 A1 * | 8/2010 | Shibazaki | 355/30 |

FOREIGN PATENT DOCUMENTS

| | | |
|---|---|---|
| CN | 101063830 | 10/2007 |
| EP | 1420298 A2 | 5/2004 |
| EP | 1420300 A2 | 5/2004 |
| JP | 2000-091207 | 3/2000 |
| JP | 2006-100686 | 4/2006 |
| JP | 2006-196898 | 7/2006 |
| JP | 2007-318129 | 12/2007 |
| KR | 20070020080 | 2/2007 |
| WO | 99/49504 A1 | 9/1999 |
| WO | 2007/004552 | 1/2007 |
| WO | WO 2007004552 A1 * | 1/2007 |

OTHER PUBLICATIONS

Office Action as issued for Chinese Patent Application No. 200910118242.X, dated Aug. 13, 2010.
Korean Office Action mailed Nov. 8, 2010 in corresponding Korean patent application No. 10-2009-0019261.
Japanese Office Action mailed Jun. 15, 2011 in corresponding Japanese Patent Application No. 2009-045257.
Japanese Office Action mailed Feb. 2, 2012 in corresponding Japanese Patent Application No. 2009-045257.

* cited by examiner

*Primary Examiner* — Toan Ton
*Assistant Examiner* — Michelle Iacoletti
(74) *Attorney, Agent, or Firm* — Pillsbury Winthrop Shaw Pittman LLP (57) ABSTRACT

A system for cleaning a limited area of a top surface of a substrate table or an object positioned on a top surface of a substrate table is disclosed. The optical system used during normal imaging is adjusted to limit the cross-sectional area of a radiation beam to form a cleaning radiation beam which impinges on the limited area.

25 Claims, 4 Drawing Sheets

LITHOGRAPHIC APPARATUS AND METHODS

This application claims priority and benefit under 35 U.S.C. §119(e) to U.S. Provisional Patent Application Ser. No. 61/064,487, entitled "Lithographic Apparatus and Methods", filed on Mar. 7, 2008, and to U.S. Provisional Patent Application Ser. No. 61/071,706, entitled "Lithographic Apparatus and Methods", filed on May 14, 2008. The contents of those applications are incorporated herein in their entirety by reference.

FIELD

The present invention relates to a lithographic apparatus and methods for cleaning a limited or localized area of a top surface of a substrate table and/or an object on the substrate table.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The liquid is desirably distilled water, although another liquid may be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable are a hydrocarbon, such as with an aromatic group, a fluorohydrocarbon, and an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

Figure 2:
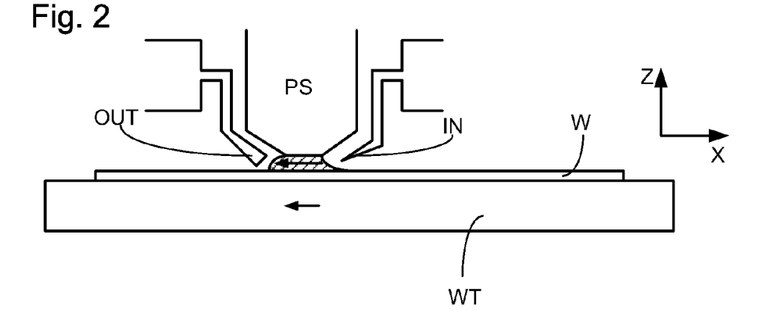
FIGS. 2 and 3 depict a liquid supply system for use in a lithographic projection apparatus.
Figure 3:
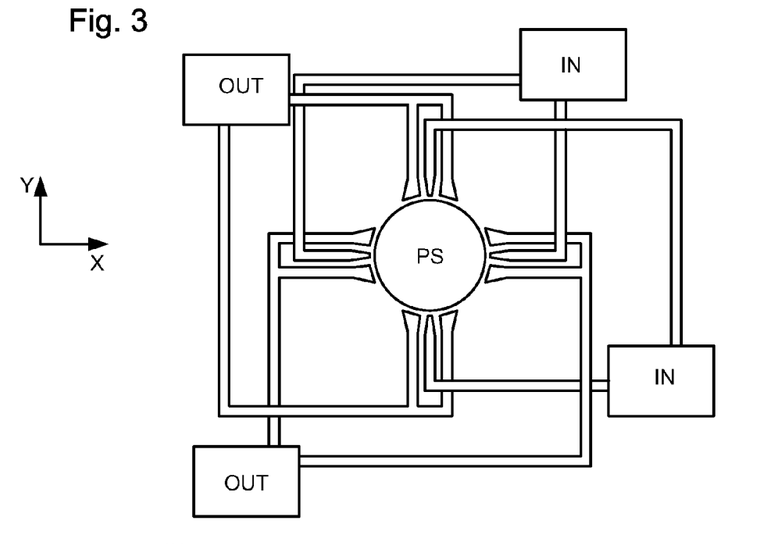

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

Figure 4:
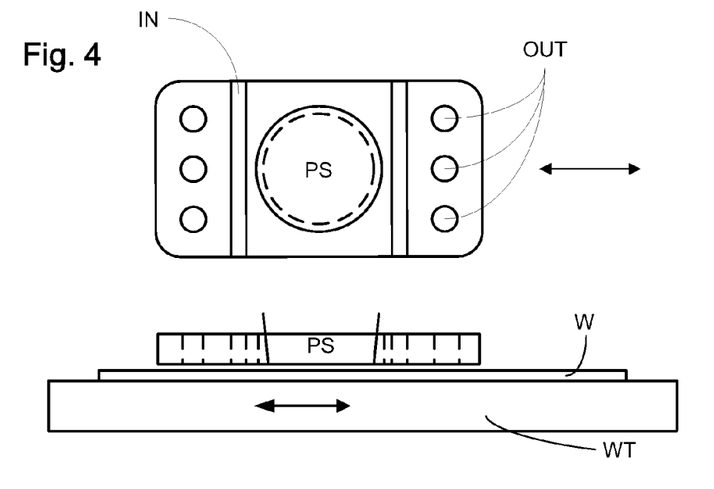
FIG. 4 depicts a further liquid supply system for use in a lithographic projection apparatus.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

In European patent application publication no. EP 1420300 and United States patent application publication no. US 2004-0136494, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

One difficulty with immersion lithography is that articles can become contaminated with contaminants in the immersion liquid. Contaminants can originate, for example, from a top coat on the surface of a substrate. In particular, if such contamination deposits onto a sensor positioned on the substrate table, this can lead to overlay errors due to a reduction in the accuracy of positioning of the substrate table, and/or of alignment, and/or of leveling measurements.

The issue of contamination in immersion lithography is more generally dealt with in United States patent application publication nos. US 2007/0127001 and US 2007/0258072. In United States patent application publication no. US 2007/0127001, flushing of a space filled with immersion liquid is performed at the same time as irradiating with ultraviolet radiation through the projection system. In United States patent application publication no. US 2007/0258072, irradiation using a separate irradiation source during cleaning is disclosed.

SUMMARY

It is desirable, for example, to provide a method and apparatus for cleaning of an area of a top surface of a substrate table or of an object on a top surface of a substrate table.

According to an aspect of the invention, there is provided a method of cleaning an area of a top surface of a substrate table or of an object on a substrate table in a lithography apparatus, the method comprising: providing a liquid between the area and a final element of an optical system of the lithography apparatus, which optical system is used in normal operation for generating and projecting a patterned beam of radiation onto a substrate; and projecting a cleaning radiation beam through the liquid using the optical system onto the area, wherein the projecting includes adjusting the optical system to limit a cross-sectional area of the cleaning radiation beam impinging on the area compared to the patterned beam of radiation.

According to an aspect of the invention, there is provided a method of cleaning an area of a sensor on a substrate table in a lithography apparatus, the method comprising: providing a liquid between the area and a final element of an optical system of the lithography apparatus, which optical system is used in normal operation for generating and projecting a patterned beam of radiation onto a substrate; and projecting a cleaning radiation beam through the liquid using the optical system onto only the sensor, wherein the cleaning radiation beam is substantially unpatterned.

According to an aspect of the invention, there is provided a method of cleaning an area of a top surface of a substrate table or of an object on a substrate table in a lithography apparatus, the method comprising: providing a liquid between the area and a final element of an optical system of the lithography apparatus, which optical system is used in normal operation for generating and projecting a patterned beam of radiation onto a substrate; and projecting a cleaning radiation beam through the liquid using the optical system onto the area, wherein the projecting includes adjusting the optical system to adjust a cross-sectional dimension of the cleaning radiation beam impinging on the top surface so that the cleaning radiation beam is limited to the area.

According to an aspect of the invention, there is provided a lithographic projection apparatus comprising: a substrate table for holding a substrate; an optical system for projecting a patterned beam of radiation onto a substrate; and a controller for controlling the apparatus in accordance with any of the above methods.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
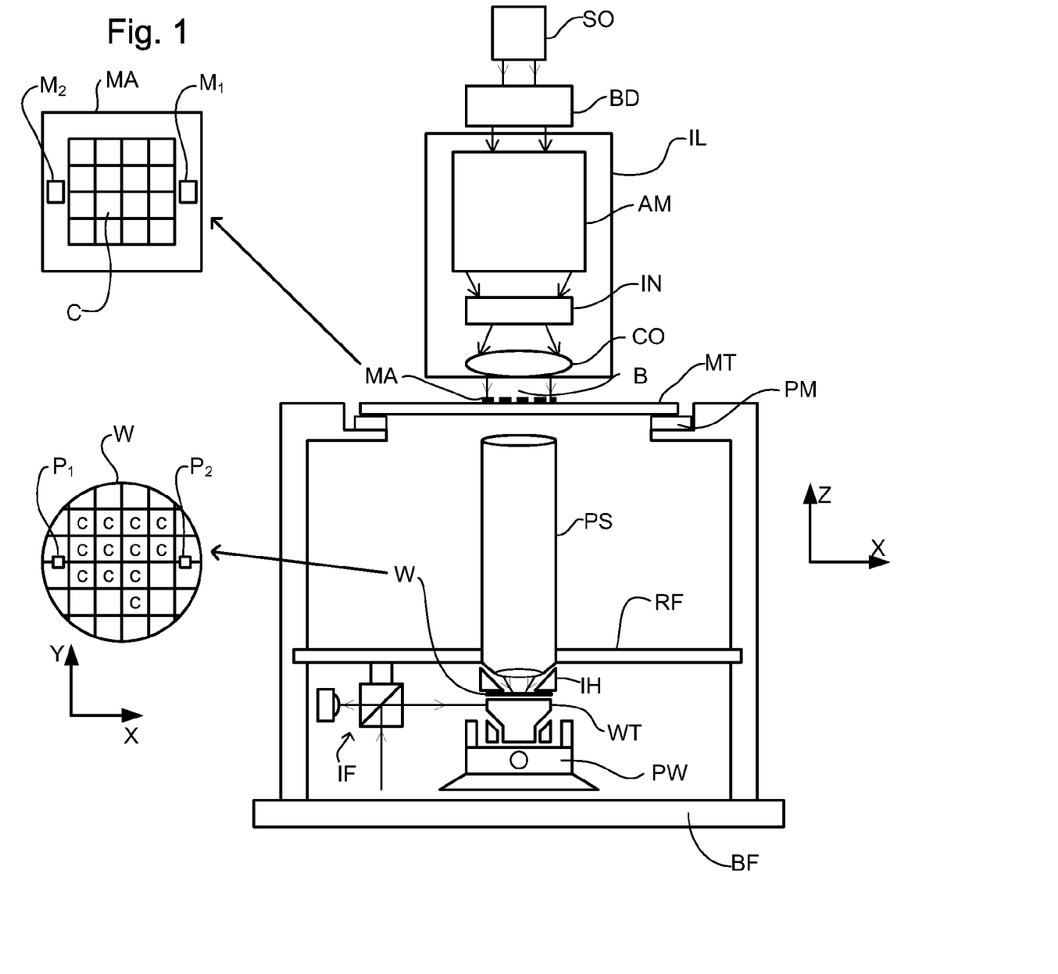
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system PS and the substrate can be classed into two general categories. These are the bath type arrangement and the so-called localized immersion system. In the bath type arrangement the whole of the substrate W and optionally part of the substrate table WT is submersed in a bath of liquid. In the localized immersion system, a liquid supply system is used which provides liquid to a localized area of the substrate. In the latter category, the space filled by liquid is smaller in plan than the top surface of the substrate and the area filled with liquid remains substantially stationary relative to the projection system PS while the substrate W moves underneath that area. A further arrangement is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the substrate. Any of the liquid supply devices of FIGS. 2-5 can be used in such a system; however, their sealing features are not present, are not activated, are not as efficient as normal or are otherwise ineffective to seal liquid to only the localized area. Four different types of localized liquid supply systems are illustrated in FIGS. 2-5. The liquid supply systems disclosed in FIGS. 2-4 were described above.

Figure 5:
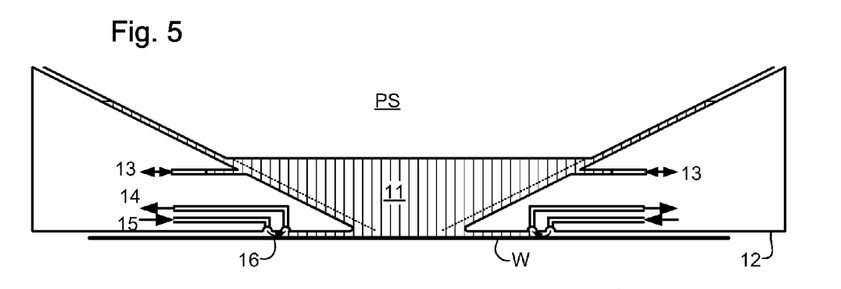
FIG. 5 depicts, in cross-section, a barrier member which may be used in an embodiment of the present invention as a liquid supply system.

FIG. 5 schematically depicts a localized liquid supply system with a barrier member 12, which extends along at least a part of a boundary of the space between (i) the final element of the projection system and (ii) the substrate table WT, the substrate W or both the substrate W and the substrate table WT. The barrier member 12 is substantially stationary relative to the projection system in the XY plane though there may be some relative movement in the Z direction (in the direction of the optical axis). In an embodiment, a seal is formed between the barrier member and the surface of the substrate. The seal may be a contactless seal such as a gas seal or fluid seal. Reference to the surface of the substrate W herein, and throughout the rest of the description, shall be taken as meaning the surface of the substrate W, the surface of the substrate table WT or both.

The barrier member 12 at least partly contains liquid in the space 11 between a final element of the projection system PL and the substrate W. A contactless seal 16 to the substrate may be formed around the image field of the projection system so that liquid is confined within the space between the substrate surface and the final element of the projection system. The space is at least partly formed by the barrier member 12 positioned below and surrounding the final element of the projection system PL. Liquid is brought into the space below the projection system and within the barrier member 12 by liquid inlet 13 and may be removed by liquid outlet 13. The barrier member 12 may extend a little above the final element of the projection system and the liquid level rises above the final element so that a buffer of liquid is provided. The barrier member 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is contained in the space 11 by a gas seal 16 which, during use, is formed between the bottom of the barrier member 12 and the surface of the substrate W. The gas seal is formed by gas, e.g. air or synthetic air but, in an embodiment, $N_2$ or another inert gas, provided under pressure via inlet 15 to the gap between barrier member 12 and substrate and extracted via outlet 14. The overpressure on the gas inlet 15, vacuum level on the outlet 14 and geometry of the gap are arranged so that there is a high-velocity gas flow 16 inwards that confines the liquid. The force of the gas on the liquid between the barrier member 12 and the substrate W contains the liquid in a space 11. Those inlets/outlets may be annular grooves, which surround the space 11. The annular grooves may be continuous or discontinuous. The flow of gas 16 is effective to contain the liquid in the space 11. Such a system is disclosed in United States patent application publication no. US 2004-0207824.

Other arrangements are possible and, as will be clear from the description below, for the purposes of an embodiment of the present invention it is not important what type of liquid supply system or liquid confinement system or the precise construction of such a system.

Figure 6:
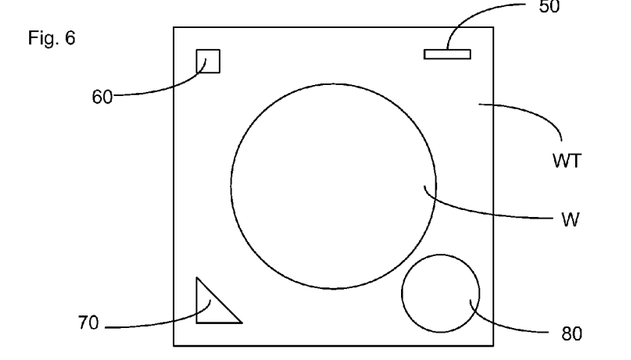
FIG. 6 illustrates, in plan, the top surface of a substrate table.

FIG. 6 illustrates, in plan, the top surface of a substrate table WT. The substrate table WT supports the substrate W. The substrate table WT may also support a closing disk or dummy substrate 80. The closing disk 80 has a size greater than the cross-sectional area of an aperture of the barrier member 12. This allows the aperture of the barrier member 12 to be blocked by positioning the barrier member over the closing disk 80. The closing disk 80 may or may not be releasable from the substrate table WT. In this way it is possible to maintain the flow of liquid through the space 10 during, for example, substrate swap. In this way, the closing disk 80 operates as a shutter member. A shutter member may include a separate substrate table, or an assembly with a surface connecting the surfaces of a plurality of substrate tables during, for example, substrate swap. Several sensors 50, 60, 70 may also be present on the top surface of the substrate table WT.

During use of an immersion lithographic apparatus, the sensors 50, 60, 70, which are mounted on the top surface of the substrate table WT, are used to make certain measurements. The sensors 50, 60, 70 may include a TIS, a lens interferometer (ILIAS), a spot sensor, etc. Often these sensors are imaged through immersion liquid. In that case contaminants can adhere to the top surface of the sensors. This can deleteriously affect their measurement performance. Other components can also suffer from being so contaminated.

In order to make the top surface of a substrate table liquidphobic to the immersion liquid, a coating may be applied to the top surface of the substrate table. Such a top surface can be sensitive to UV radiation (for example the wavelength used in immersion lithography is 193 nm and such a liquidphobic coating can be sensitive to radiation of that wavelength). The reason for providing the top surface of the substrate table with a liquidphobic coating is to increase the relative speed between the substrate table and the projection system PS and confinement structure 12. During scanning, the substrate table WT may be moved underneath and relative to the projection system and the liquid confinement structure 12. The meniscus of the immersion liquid has as a higher receding contact angle on a surface with greater liquidphobic properties. A higher receding contact angle is indicative of greater meniscus stability. Greater meniscus stability enables faster speeds of relative movement of the substrate table WT and/or substrate W and the liquid confined in the confinement structure 12 in the space 11. The liquidphobic coating may help to maintain meniscus stability. Thereby the risk of droplets forming on the substrate and causing bubbles to form in the reservoir 11 between the projection system PS and the substrate W is reduced. Thus the use of a liquidphobic coating may help to achieve higher scan speeds.

In an embodiment of the present invention, the projection beam ordinarily used for imaging of the substrate is also used during cleaning of a limited area of or an object (for example a sensor 50, 60, 70) on the top surface of the substrate table WT. Measures are taken to avoid radiation impinging on the areas of the substrate table covered in UV radiation sensitive material.

Ordinarily a beam of radiation which impinges on the substrate W or on the sensors 50, 60, 70 would have a cross-sectional area which, if directed towards a sensor 50, 60, 70, would cover the entire sensor (or an area much larger than a part of the sensor from which the contamination is to be removed) and thereby a surrounding area of the top surface of the substrate table covered in UV radiation sensitive material. The optical system used during normal imaging is adjusted to limit the cross-sectional area of the radiation beam to form a cleaning radiation beam, which impinges on the limited area or object. The optical system includes the illumination system IL (which ordinarily includes one or more blades intended to shape the radiation beam (reticle masking blades)) and the projection system PS.

Figure 7:
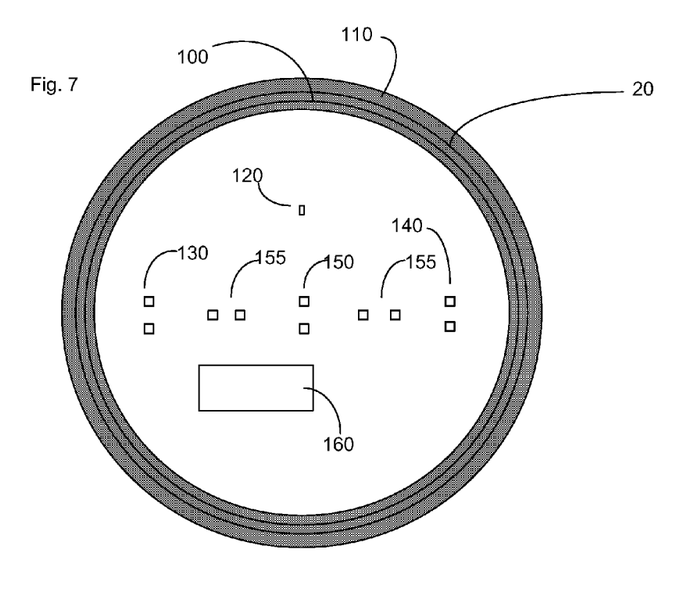
FIG. 7 illustrates, in plan, the top surface of a transmission image sensor (TIS)

FIG. 7 illustrates the top surface of a TIS, which is typically mounted on a top surface of a substrate table WT. The top surface of a substrate table WT has a recess 20 in which the sensor 100 is mounted. The sensor 100 of FIG. 7 may be any one of sensors 50, 60, 70 of FIG. 6. A seal 110 is placed over the gap between the edge of the recess 20 and the edge of the sensor 100. In this way immersion liquid can be prevented from entering into that gap. The area of the substrate table WT surrounding the sensor 100 may comprise a UV sensitive coating, as described above.

There are several different sets of areas on the sensor which are used for different purposes. Mark 120 may be unused.

Areas 130, 140 and 150 each comprise two marks. These are used during leveling measurements. These marks are not illuminated by radiation through the projection system PS during leveling but are imaged by a red and green laser during leveling operations. Two further sets of marks 155 are used for blue image alignment (alignment of the patterning device MA to the sensor 100). These marks are projected with patterned laser radiation from the projection system PS. Other marks may also be present such as those in area 160. These marks could be used, for example, for calibration purposes. They are illuminated with visible light. For simplicity not all features of the top surface of a TIS have been illustrated. However, it will be apparent from the above description in conjunction with FIG. 7 that for making proper measurements only small areas of the top surface of the sensor are required to be clean. That is, only one or more of those areas 120, 130, 140, 150, 155, 160 described above need to be clean.

If one or more of those areas 120, 130, 140, 150, 155, 160 are imaged with radiation of the same wavelength as the projection beam (which has a wavelength of 193 nm) for imaging a substrate, this can lead to cleaning of the surface of those one or more areas 120, 130, 140, 150, 155, 160. The mechanism for this appears to be that: photons of UV radiation in the projection beam have sufficient energy to interact and break chemical bonds of contaminants, for example organic contaminants, present on the surface to be cleaned. The interaction of a photon with a contaminating molecule breaks the molecule down into smaller molecules. The smaller molecules may be polar. The smaller molecules, especially the polar molecules, dissolve into the liquid (e.g., water). As the liquid is flowing away, out of the space 11, the contaminants are removed. By this mechanism, a surface exposed to the beam of radiation may be cleaned.

In an embodiment, the cleaning radiation beam is unpatterned. By this is meant that no pattern is imparted into the cross-section of the beam. However, the shape and size of the cross-section of the beam may be varied. It will be appreciated that there may be some variations in the intensity of the beam in its cross-section. Therefore, unpatterned can be seen as meaning that the beam is not projected through a pattern on a patterning device (though as will be understood from the below, a patterning device can be used to vary the cross-sectional area and/or shape of the beam).

The desired dose depends on how frequently cleaning is performed. If cleaning is performed daily or more frequently, a dose of as little as 25 J/cm$^2$ may be enough to keep an area 120, 130, 140, 150, 155, 160 clean. For cleaning marks 130, 140 daily, a 10 second clean on each mark 130, 140 of four transmission image sensors will take about 100 seconds including substrate table moves. This equates to about a 50 J/cm$^2$ daily dosage. A daily equivalent dosage of above 25 J/cm$^2$ is therefore desired. For areas which are cleaned less regularly, or which have become particularly contaminated, in order to effect good cleaning a dose in the region of 2 kJ/cm$^2$ may be suitable. However, cleaning at a dose of above 0.3 kJ/cm$^2$ is effective. Desirably the dose is above 0.4, above 0.5, above 0.75, above 1.00, above 1.25 or above 1.5 kJ/cm$^2$. Most desirably the dose is above 2 kJ/cm$^2$ or above 3 kJ/cm$^2$. This compares with a typical dose used for fine alignment in area 155 of about 0.25 kJ/cm$^2$. As will be appreciated, the beam of radiation for projecting a pattern onto the substrate comprises a pulsed beam operating at about 5,000 mW/cm$^2$ at 6 kHz. Thus, each pulse has an energy of about 0.84 mJ/cm$^2$ (though for fine alignment using area 155 the energy is reduced by about 75% of this, namely to about 0.21 mJ/pulse/cm$^2$). For cleaning, the reduction of the pulse energy can be omitted. Thus, cleaning can be performed in about 100 seconds for each area, desirably less than 100 seconds, less than 90 seconds or less than 80 seconds.

In an embodiment, cleaning of the sensor is done with a substrate or a dummy substrate present in a recess for the substrate W on the substrate table WT. This is because it is desirable for a substrate to be present in the recess in order to prevent or reduce immersion liquid leaking into the recess when the liquid supply system 12 is activated. However, there may be arrangements in which the substrate is not present, likely at the cost of increased complexity.

It is unnecessary to clean the TIS after the imaging of each substrate. Typically a batch of substrates comprises about 25 substrates. After each batch a so-called "LOT" correction is made. That involves illumination of the marks in area 155. Those marks 155 are also imaged for each substrate W in order to align the patterning device. The other marks are rarely, if ever, imaged, in conventional operation, by the beam of radiation used for transferring of the pattern to the substrate. Those marks 120, 130, 140, 150, 160 could be cleaned with that beam radiation during each LOT correction. Preventative cleaning may be carried out, which requires periodic exposure to the beam of radiation. Preventative cleaning could take place once a day, during each LOT correction, or for every substrate, for example, and involves irradiating the areas of the sensor, which may need cleaning. The frequency of cleaning is not important so long as the area of the sensor is clean when it is used for measurement. This cleaning irradiation is an extra irradiation of the areas over and above the irradiation required for the various measurements made by the sensor. However, exposure is shorter for preventative cleaning than for full cleaning, for example for 50 ms or between 200 and 400 pulses, more desirably 300 pulses for each mark on the sensor.

It will be appreciated that it may not be necessary to clean some of the areas as often as other of the areas.

In order successfully to irradiate only those areas desired, the cross-sectional area of the cleaning beam of radiation is restricted. In particular, in order to avoid irradiating areas of the UV sensitive material on the top surface of the substrate table described above, this type of restriction is particularly desirable. Therefore, the optical system includes an adjuster configured to limit the cross-sectional area of the cleaning radiation beam impinging on the cleaning area compared to the beam of radiation used for imaging of a substrate. The cleaning area can therefore be regarded as being a limited area. A controller can be provided to control the adjuster. The controller may be connected to a processor. The cleaning process may be run automatically, by the processor following a computer program.

Typically the adjuster adjusts the cross-sectional area of the cleaning radiation beam to have dimensions of the order of 10×10 mm. This compares with a slit size of 8×26 mm used during exposure of a substrate. This area allows targeted cleaning of the various areas on the top surface of the sensor 100. The sensor has a cross-sectional dimension (e.g., diameter) of about 60 mm so that it can be seen that illuminating an area of about 10×10 mm will allow each of the areas 120, 130, 140, 150, 155, 160 selectively to be cleaned.

Figure 8:
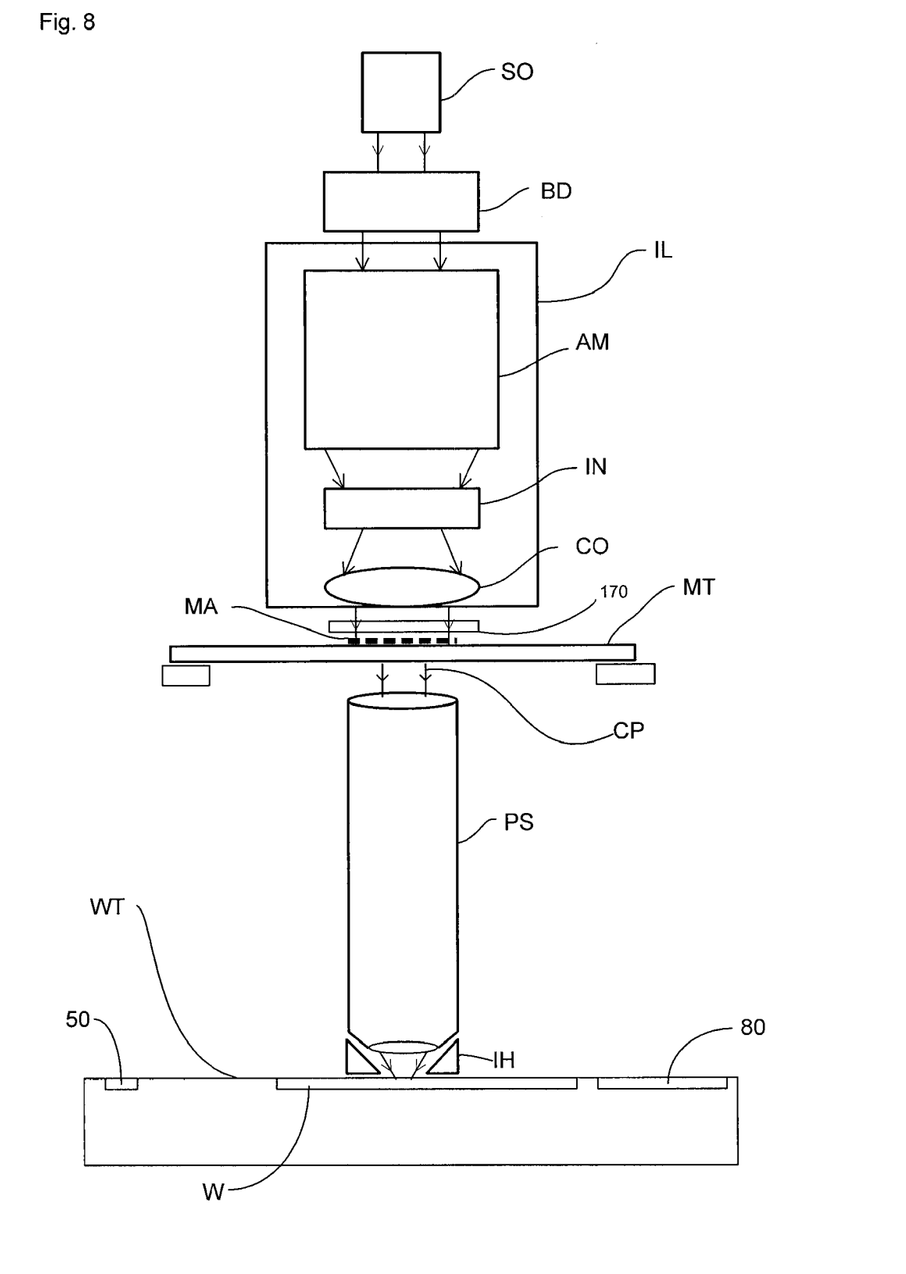
FIG. 8 illustrates, in cross-section, an illumination and a projection system which have been optimized for use in an embodiment of the present invention.

FIG. 8 illustrates the optical system including the illumination and projection systems of a lithographic apparatus. Two ways of adjusting the cross-sectional area of the cleaning radiation beam are illustrated. The first of these is by the use of so called reticle edge masking blades (REMA blades) 170. These blades 170 are present in a lithographic apparatus in any case. They are used to limit the cross-sectional area of the beam B. In theory they can be used to limit the cross-sectional area to any desired size. If REMA blades 170 are used to adjust the cross-sectional area of the cleaning radiation beam, then it is unnecessary to have a patterning device MA in place at the support structure MT.

Another alternative is to provide a patterning device MA having, or capable of providing, an aperture which is effective to adjust the cross-sectional area of the cleaning radiation beam. The patterning device MA would be positioned at the support structure MT. The patterning device would desirably not impart any pattern in the cross-section of the cleaning radiation beam.

Either of the above two methods would result in a narrowing of the beam B to a cleaning radiation beam CP as illustrated below the support structure MT in FIG. 8.

Other ways of adjusting the cross-sectional areas of the cleaning radiation beam are possible. For example, it may be possible to interpose a shield with an aperture through it underneath the projection system. Also, it may be possible to use a shield underneath the support structure MT or elsewhere in the optical system to reduce the cross-sectional area. Indeed the patterning device MA and/or the REMA blades 170 can be viewed as being such a shield. Another way, for example using a patterning device with a few features, is to set the patterning device out of focus.

Using the above methodology allows cleaning of the TIS to take place in as little as 15 minutes.

Although an embodiment of the present invention has been described above in relation to cleaning of areas of a TIS, an embodiment of the invention can be used for cleaning other parts of the substrate table or any other object on the substrate table. For example, the same methodology can be used for cleaning other types of sensors. Other types of sensors which may be cleaned using an embodiment of the present invention include an ILIAS sensor and a spot sensor. Other objects may also benefit from cleaning. This includes a so-called dummy substrate or closing disk 80 or another shutter member. Such a shutter member or closing disk, or a feature of such a device, can easily become contaminated. An embodiment of the present invention is suited to cleaning at least a part of a shutter member without the risk of damaging the UV radiation sensitive layer or top surface of the substrate table WT.

During cleaning it is also possible to move the substrate table WT under the projection system PS. Thus, more than one area can be cleaned in one cleaning cycle.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described above may have any suitable configuration for receiving, processing, and sending signals. For example, each controller may include one or more processors for executing the computer programs that include machine-readable instructions for the methods described above. The controllers may also include data storage medium for storing such computer programs, and/or hardware to receive such medium.

One or more embodiments of the invention may be applied to any immersion lithography apparatus, in particular, but not exclusively, those types mentioned above and whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A method of cleaning an area of a top surface of a table or of an object on a table in a lithography apparatus, the method comprising:
providing a liquid between the area and an optical system of the lithography apparatus, which optical system is used in normal operation to generate and project a patterned beam of radiation onto a substrate; and
projecting a cleaning radiation beam through the liquid using the optical system onto the area,
wherein the projecting includes adjusting the optical system to limit a cross-sectional area of the cleaning radiation beam impinging on the area compared to the patterned beam of radiation.

2. The method of claim 1, wherein the adjusting the optical system comprises adjusting the size and/or shape of an aperture through which the cleaning radiation beam passes prior to passing through an area where a patterning device is, or will be, located during imaging of a substrate.

3. The method of claim 1, wherein the adjusting comprises placing a patterning device in the optical system.

4. The method of claim 1, wherein the optical system includes an illumination system and a projection system and wherein the adjusting occurs in an optical path before the illumination system, in the illumination system, between the illumination system and the projection system, in the projection system or after the projection system.

5. The method of claim 1, wherein the cleaning radiation beam is substantially unpatterned.

6. The method of claim 1, wherein the cleaning radiation beam comprises radiation with a wavelength of substantially about 193 nm.

7. The method of claim 1, wherein a dose of at least 25 J/cm$^2$ is applied to the limited area by the cleaning radiation beam.

8. The method of claim 1, wherein the area is on the object.

9. The method of claim 8, wherein the object is a sensor.

10. The method of claim 8, wherein the object is a closing disk.

11. The method of claim 9, wherein during the cleaning the sensor is not operational.

12. The method of claim 9, wherein the object comprises a TIS, an ILIAS sensor and/or a spot sensor.

13. The method of claim 1, wherein the cleaning takes place with a substrate present on the table.

14. The method of claim 1, wherein the table is a substrate table configured to hold the substrate.

15. A method of cleaning an area of a sensor on a table in a lithography apparatus, the method comprising:
   providing a liquid between the area and an optical system of the lithography apparatus, which optical system is used in normal operation to generate and project a patterned beam of radiation onto a substrate; and
   projecting a cleaning radiation beam through the liquid using the optical system onto only the sensor,
   wherein the cleaning radiation beam is substantially unpatterned.

16. The method of claim 15, wherein the projecting comprises projecting the cleaning radiation beam onto only part of the sensor.

17. The method of claim 16, wherein the part comprises (i) an alignment mark used for leveling, or (ii) an alignment mark used for aligning a patterning device, or (iii) an alignment mark used for coarse alignment, or (iv) an alignment mark used for fine positioning, or (v) any combination selected from (i)-(iv).

18. The method of claim 15, wherein the table is a substrate table configured to hold the substrate.

19. A method of cleaning an area of a top surface of a table or of an object on a table in a lithography apparatus, the method comprising:
   providing a liquid between the area and an optical system of the lithography apparatus, which optical system is used in normal operation to generate and project a patterned beam of radiation onto a substrate; and
   projecting a cleaning radiation beam through the liquid using the optical system onto the area,
   wherein the projecting includes adjusting the optical system to adjust a cross-sectional dimension of the cleaning radiation beam impinging on the top surface so that the cleaning radiation beam is limited to the area.

20. The method of claim 19, wherein the cross-sectional dimension is the width of a cross-section of the cleaning radiation beam.

21. The method of claim 19, wherein the table is a substrate table configured to hold the substrate.

22. A lithographic projection apparatus, comprising:
   a movable table;
   an optical system configured to project a patterned beam of radiation onto a substrate; and
   a controller configured to control the apparatus to clean an area of a top surface of the table or of an object on the table by causing provision of a liquid between the area and the optical system and projection of a cleaning radiation beam through the liquid using the optical system onto the area, wherein the projection includes adjustment of the optical system to limit a cross-sectional area of the cleaning radiation beam impinging on the area compared to the patterned beam of radiation.

23. The apparatus of claim 22, wherein a top surface of the table comprises a UV sensitive coating.

24. The apparatus of claim 22, further comprising a sensor positioned on the table, wherein the controller is configured to control cleaning of the sensor without the cleaning radiation beam impinging onto a UV sensitive layer.

25. The apparatus of claim 22, wherein the table is a substrate table configured to hold the substrate.

* * * * *